United States Patent
Ikuta et al.

(10) Patent No.: US 8,410,472 B2
(45) Date of Patent: Apr. 2, 2013

(54) EPITAXIAL SUBSTRATE FOR ELECTRONIC DEVICE AND METHOD OF PRODUCING THE SAME

(75) Inventors: Tetsuya Ikuta, Tokyo (JP); Jo Shimizu, Tokyo (JP); Tomohiko Shibata, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 176 days.

(21) Appl. No.: 13/139,428

(22) PCT Filed: Dec. 14, 2009

(86) PCT No.: PCT/JP2009/006840
§ 371 (c)(1),
(2), (4) Date: Jun. 13, 2011

(87) PCT Pub. No.: WO2010/070863
PCT Pub. Date: Jun. 24, 2010

(65) Prior Publication Data
US 2011/0240962 A1 Oct. 6, 2011

(30) Foreign Application Priority Data

Dec. 15, 2008 (JP) .................................. 2008-318435
Feb. 19, 2009 (JP) .................................. 2009-036863
Dec. 10, 2009 (JP) .................................. 2009-280860

(51) Int. Cl.
*H01L 29/06* (2006.01)
(52) U.S. Cl. ........................................................ 257/15
(58) Field of Classification Search .................. 257/15, 257/194, E29.025, E21.09; 438/172
See application file for complete search history.

(56) References Cited

U.S. PATENT DOCUMENTS

| 7,638,819 | B2 * | 12/2009 | Kikkawa et al. | 257/194 |
| 2003/0102482 | A1 | 6/2003 | Saxler | |
| 2005/0051804 | A1 | 3/2005 | Yoshida | |
| 2006/0121682 | A1 | 6/2006 | Saxler | |
| 2007/0045639 | A1 * | 3/2007 | Kato et al. | 257/94 |
| 2011/0024796 | A1 * | 2/2011 | Miyoshi et al. | 257/194 |
| 2011/0298009 | A1 * | 12/2011 | Ikuta et al. | 257/190 |

FOREIGN PATENT DOCUMENTS

| CN | 1599960 A | 3/2005 |
| JP | A-2003-258005 | 9/2003 |
| JP | A-2003-282598 | 10/2003 |
| JP | A-2005-085852 | 3/2005 |

(Continued)

OTHER PUBLICATIONS

International Search Report issued in Application No. PCT/JP2009/006840; Dated Mar. 16, 2010 (With Translation).

(Continued)

*Primary Examiner* — Trung Q Dang
(74) *Attorney, Agent, or Firm* — Oliff & Berridge, PLC (57) ABSTRACT

An epitaxial substrate for an electronic device having a Si single crystal substrate, a buffer as an insulating layer formed on the Si single crystal substrate, and a main laminated body formed by plural group III nitride layers epitaxially grown on the buffer, wherein a lateral direction of the epitaxial substrate is defined as an electric current conducting direction. The buffer including at least an initially grown layer in contact with the Si single crystal substrate and a superlattice laminate constituted of a superlattice multilayer structure on the initially grown layer.

6 Claims, 6 Drawing Sheets

FOREIGN PATENT DOCUMENTS

| | | |
|---|---|---|
| JP | A-2005-512327 | 4/2005 |
| JP | A-2006-114655 | 4/2006 |
| JP | A-2007-251144 | 9/2007 |
| JP | A-2008-522447 | 6/2008 |
| JP | A-2008-227478 | 9/2008 |

OTHER PUBLICATIONS

Dec. 14, 2012 Office Action issued in Chinese Patent Application No. 200980156805.2; with English-language translation.

* cited by examiner

EPITAXIAL SUBSTRATE FOR ELECTRONIC DEVICE AND METHOD OF PRODUCING THE SAME

TECHNICAL FIELD

The present invention relates to an epitaxial substrate for an electronic device and a method of producing the same, in particular, to an epitaxial substrate for HEMT and a method of producing the same.

PRIOR ART

Figure 1:
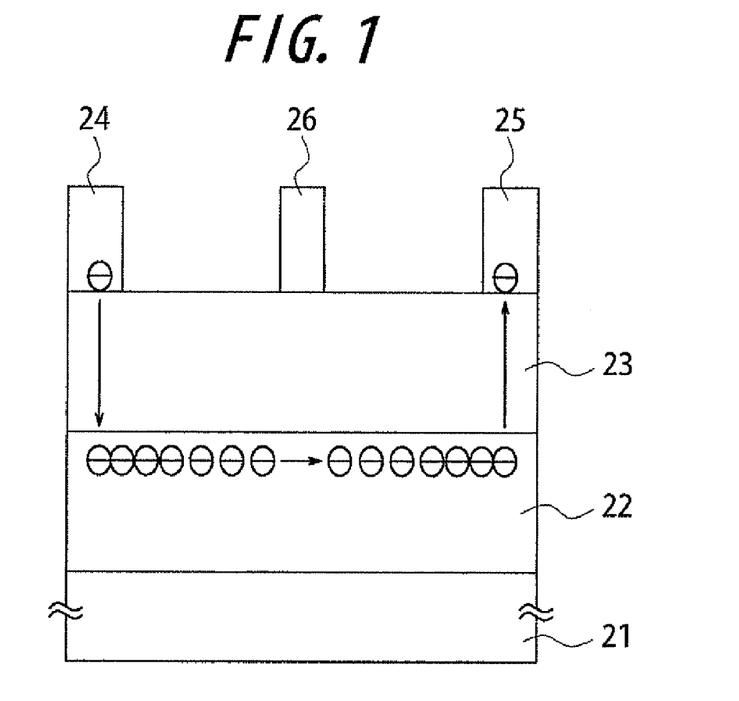
FIG. 1 is a schematic sectional view showing a conventional field effect transistor.

In recent years, HEMT (High electron mobility transistor) has been widely used as high-speed FET (Field effect transistor) as speed required of an IC device increases. Such a FET-type transistor as described above is generally formed, as schematically illustrated in FIG. 1, for example, by laminating a channel layer 22 and an electron supply layer 23 on a substrate 21 and then providing a surface of the electron supply layer 23 with a source electrode 24, a drain electrode 25 and a gate electrode 26. When this transistor device is operated, electrons are moved through the source electrode 24, the electron supply layer 23, the channel layer 22, the electron supply layer 23 and the drain electrode 25 in this order, thereby defining the lateral direction of the device as a current conducting direction. This movement of electrons in the lateral direction is controlled by voltage applied on the gate electrode 26. In a HEMT, electrons generated at a joint interface between the electron supply layer 23 and the channel layer 22 of which band gaps are different from each other can move significantly fast, as compared with electrons in a conventional semiconductor.

Movement of electrons in a lateral direction, i.e. electric current, is controlled by a gate voltage, as described above. Electric current generally does not drop to zero when a gate voltage is turned off and electric current flowing when a gate voltage is turned off is called "leakage current". Increase in leakage current results in increase in power consumption, possibly causing problems such as heat generation. Leakage current is generally classified to lateral leakage current and vertical leakage current. Lateral leakage current represents leakage current flowing between two electrodes (e.g. the source electrode 24 and the drain electrode 25) provided on a surface of the electron supply layer 23. Vertical leakage current represents leakage current flowing between two electrodes disposed at a surface of the electron supply layer 23 and a surface of the substrate 21, respectively.

JP 2007-251144 discloses a technique of, in a HEMT having a buffer layer, carbon concentration transition layer, a channel layer and an electron supply layer, decreasing lateral leakage current generated in the buffer layer and the carbon concentration transition layer and enhancing withstand voltage in a lateral direction by forming these layers such that carbon concentration increases from the channel layer to the buffer layer.

JP 2005-085852 discloses a technique of, in a semiconductor device having a superlattice buffer layer, a channel layer and an electron supply layer on a substrate, suppressing lateral leakage current of the semiconductor electronic device and enhancing withstand voltage in a lateral direction by including carbon in the superlattice buffer layer.

JP 2003-282598 discloses a technique, in a semiconductor electronic device having a single crystal substrate, a first group III nitride base layer formed on the substrate, and a second group III nitride base layer formed on the first group III nitride base layer, wherein an acceptor impurity exists at an interface between the first base layer and the second base layer, of suppressing lateral leakage current of the semiconductor electronic device by decreasing concentration of the acceptor impurity from the interface toward the second group III nitride base layer in the thickness direction.

Incidentally, in a case where a HEMT is operated at a relatively high frequency, it is necessary to decrease not only leakage current described above but also loss upon application of high frequency signals. This loss occurs because, in a case where electric charge exists in a substrate or an epitaxial film thereon, a depletion layer fails to expand efficiently and the charge causes capacitive or inductive interactions with an electrode provided on a surface of the substrate.

In view of this problem, JP 2008-522447 discloses a technique of decreasing carriers to suppress loss in a semiconductor electronic device at a high-frequency region, by preventing a Si single crystal substrate from being contaminated by impurities by increasing specific resistance of the Si single crystal substrate.

However, in the invention disclosed in JP 2007-251144, there arises a problem in that, since a GaN-based low temperature buffer layer is employed when a group III nitride layer is grown on a substrate, a through-defect such as a pit is generated in a case where the substrate uses Si due to a reaction between Si and Ga, possibly deteriorating withstand voltage in the vertical direction.

Further, in the invention disclosed in JP 2005-085852, leakage current at the interface between the cannel layer and the superlattice buffer layer cannot be sufficiently suppressed, although leakage current in the superlattice buffer layer can be suppressed, whereby withstand voltage in the vertical direction and withstand voltage in a lateral direction both deteriorate.

Yet further, JP 2003-282598 and JP 2008-522447, which consider neither withstand voltage in the vertical direction nor withstand voltage of the buffer layer, cannot ensure sufficient withstand voltage in the vertical direction when applied to a semiconductor substrate such as a Si substrate.

SUMMARY OF THE INVENTION

Problems to be Solved by the Invention

An object of the present invention is to provide an epitaxial substrate for an electronic device capable of making decrease in lateral leakage current and achievement of good properties of withstand voltage in a lateral direction compatible and enhancing withstand voltage in the vertical direction, as well as a method of producing said epitaxial substrate.

Means for Solving the Problems

In order to achieve the aforementioned object, a structure of the present invention is primarily as follows.

(1) An epitaxial substrate for an electronic device comprising a Si single crystal substrate, a buffer as an insulating layer formed on the Si single crystal substrate, and a main laminated body formed by plural group III nitride layers epitaxially grown on the buffer, wherein a lateral direction of the epitaxial substrate is defined as an electric current conducting direction, characterized in that: the buffer includes at least an initially grown layer in contact with the Si single crystal substrate and a superlattice laminate constituted of a superlattice multilayer structure on the initially grown layer; the initially grown layer is made of an AlN material; the superlattice laminate is formed by alternate lamination of a first layer made of a $B_{a1}Al_{b1}Ga_{c1}In_{d1}N$ ($0 \leq a_1 \leq 1$, $0 \leq b_1 \leq 1$, $0 \leq c_1 \leq 1$, $0 \leq d_1 \leq 1$, $a_1+b_1+c_1+d_1=1$) material and a second layer made of a $B_{a2}Al_{b2}Ga_{c2}In_{d2}N$ ($0 \leq a_2 \leq 1$, $0 \leq b_2 \leq 1$, $0 \leq c_2 \leq 1$, $0 \leq d_2 \leq 1$, $a_2+b_2+c_2+d_2=1$) material having a band gap different from that of the first layer; and both of the superlattice laminate and a portion, on the buffer side, of the main laminated body has carbon concentration of $1 \times 10^{18}/\text{cm}^3$ or higher.

(2) The epitaxial substrate for an electronic device of (1) above, wherein the first layer is made of an AlN material and the second layer is made of $Al_{b2}Ga_{c2}N$ ($a_2=0$, $0<b_2\leq 0.5$, $0.5\leq c_2<1$, $d_2=0$).

(3) The epitaxial substrate for an electronic device of (1) or (2) above, wherein: the Si single crystal substrate has specific resistance of 1000 Ω·cm or higher and total maximum concentrations of group III atoms in a portion of the Si single crystal substrate, from the interface between the substrate and the initially grown layer to 0.1 μm depth of the substrate, is $1 \times 10^{16}/\text{cm}^3$ or lower; and total concentrations of group III atoms of the Si single crystal substrate, at a position from the interface between the substrate and the initially grown layer to 0.3 μm depth of the substrate, is $1 \times 10^{15}/\text{cm}^3$ or lower.

(4) A method of producing an epitaxial substrate for an electronic device by sequentially forming on a Si single crystal substrate a buffer as an insulating layer and a main laminated body as plural group III nitride layers epitaxially grown on the buffer, wherein a lateral direction of the epitaxial substrate is defined as an electric current conducting direction, comprising the steps of: forming the buffer so as to include at least an initially grown layer in contact with the Si single crystal substrate and a superlattice laminate constituted of a superlattice multilayer structure on the initially grown layer; forming the initially grown layer by an AlN material; forming the superlattice laminate by alternately laminating a first layer made of a $B_{a1}Al_{b1}Ga_{c1}In_{d1}N$ ($0\leq a_1\leq 1$, $0\leq b_1\leq 1$, $0\leq c_1\leq 1$, $0\leq d_1\leq 1$, $a_1+b_1+c_1+d_1=1$) material and a second layer made of a $B_{a2}Al_{b2}Ga_{c2}In_{d2}N$ ($0\leq a_2\leq 1$, $0\leq b_2\leq 1$, $0\leq c_2\leq 1$, $0\leq d_2\leq 1$, $a_2+b_2+c_2+d_2=1$) material having a band gap different from that of the first layer; and forming both of the superlattice laminate and a portion, on the buffer side, of the main laminated body to have carbon concentration of $1 \times 10^{18}/\text{cm}^3$ or higher.

(5) The method of producing an epitaxial substrate for an electronic device of (4) above, further comprising forming the Si single crystal substrate to have: specific resistance of 1000 Ω·cm or higher; total maximum concentrations of group III atoms of $1 \times 10^{16}/\text{cm}^3$ or lower in a portion thereof from the interface between the substrate and the initially grown layer to 0.1 μm depth of the substrate; and total concentrations of group III atoms of $1 \times 10^{15}/\text{cm}^3$ or lower at a position thereof from the interface between the substrate and the initially grown layer to 0.3 μm depth of the substrate.

Effect of the Invention

The epitaxial substrate for an electronic device of the present invention has a buffer including an initially grown layer made of an AlN material and a predetermined superlattice laminate, a predetermined main laminated body on the buffer, and both of the superlattice laminate and a portion on the buffer side of the main laminated body has carbon concentration of $1 \times 10^{18}/\text{cm}^3$ or higher. Accordingly, it is possible not only to make decrease in lateral leakage current and achievement of good properties of withstand voltage in a lateral direction compatible but also enhance withstand voltage in the vertical direction.

Further, since the epitaxial substrate for an electronic device of the present invention has a buffer including an initially grown layer made of an AlN material and a predetermined superlattice laminate, a predetermined main laminated body on the buffer, and both of the superlattice laminate and a portion on the buffer side of the main laminated body has carbon concentration of $1 \times 10^{18}/\text{cm}^3$ or higher, it is possible to produce an epitaxial substrate for an electronic device capable of making decrease in lateral leakage current and achievement of good properties of withstand voltage in a lateral direction compatible, as well as enhancing withstand voltage in the vertical direction.

Yet further, the Si single crystal substrate has specific resistance of 1000 Ω·cm or higher; total maximum concentrations of group III atoms in a portion of the Si single crystal substrate, from the interface between the substrate and the initially grown layer to 0.1 μm depth of the substrate, is $1 \times 10^{16}/\text{cm}^3$ or lower; and total concentrations of group III atoms the Si single crystal substrate, at a position from the interface between the substrate and the initially grown layer to 0.3 μm depth of the substrate, is $1 \times 10^{15}/\text{cm}^3$ or lower in the epitaxial substrate for an electronic device of the present invention, whereby an effect of decreasing loss when the electronic device is operated at a relatively high frequency can also be obtained in addition to the aforementioned superior effects.

Yet further, the Si single crystal substrate is formed to have: specific resistance of 1000 Ω·cm or higher; total maximum concentrations of group III atoms of $1 \times 10^{16}/\text{cm}^3$ or lower in a portion thereof from the interface between the substrate and the initially grown layer to 0.1 μm depth of the substrate; and total concentrations of group III atoms of $1 \times 10^{15}/\text{cm}^3$ or lower at a position thereof from the interface between the substrate and the initially grown layer to 0.3 μm depth of the substrate in the present invention, whereby an effect of producing an epitaxial substrate for an electronic device capable of decreasing loss when the electronic device is operated at a relatively high frequency can also be obtained in addition to the aforementioned superior effects.

BEST EMBODIMENT FOR CARRYING OUT THE INVENTION

Figure 2:
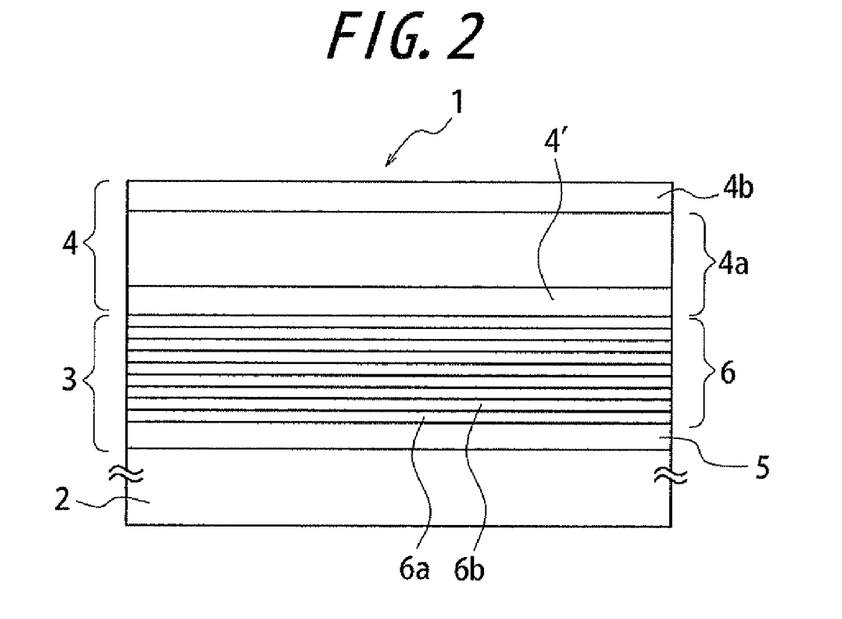
FIG. 2 is an schematic sectional view of an epitaxial substrate for an electronic device according to the present invention.

Next, an embodiment of an epitaxial substrate for an electronic device of the present invention will be described with reference to drawings. FIG. 2 schematically shows a sectional structure of an epitaxial substrate for an electronic device according to the present invention. The epitaxial substrate is illustrated with exaggeration in thickness direction thereof in FIG. 2 for conveniences in explanation.

As shown in FIG. 2, the epitaxial substrate 1 for an electronic device of the present invention has a Si single crystal substrate 2, a buffer 3 as an insulating layer formed on the Si single crystal substrate 2, and a main laminated body 4 formed by plural group III nitride layers epitaxially grown on the buffer 3, wherein a lateral direction of the epitaxial substrate is defined as an electric current conducting direction. Specifically, the buffer 3 includes at least an initially grown layer 5 in contact with the Si single crystal substrate 2 and a superlattice laminate 6 constituted of a superlattice multilayer structure on the initially grown layer 5. The initially grown layer 5 is made of an AlN material. The superlattice laminate 6 is formed by alternate lamination of a first layer 6a made of a $B_{a1}Al_{b1}Ga_{c1}In_{d1}N$ ($0 \leq a_1 \leq 1, 0 \leq b_1 \leq 1, 0 \leq c_1 \leq 1, 0 \leq d_1 < 1, a_1+b_1+c_1+d_1=1$) material and a second layer 6b made of a $B_{a2}Al_{b2}Ga_{c2}In_{d2}N$ ($0 \leq a_2 \leq 1, 0 \leq b_2 \leq 1, 0 \leq c_2 \leq 1, 0d_2 \leq 1, a_2+b_2+c_2+d_2=1$) material having a band gap different from that of the first layer. Both of the superlattice laminate 6 and a portion 4', on the buffer 3 side, of the main laminated body 4 has carbon (C) concentration of $1 \times 10^{18}/cm^3$ or higher. Due to the structure described above, it is possible not only to make decrease in lateral leakage current and achievement of good properties of withstand voltage in a lateral direction compatible but also enhance withstand voltage in the vertical direction.

Crystal-face orientation of the Si single crystal substrate 2 is not particularly specified and (111) face, (100) face, (110) face or the like can be use. Use of (111) face is preferable in terms of growing (0001) face of group III nitrides with satisfactory surface flatness. The conduction type of the Si single crystal substrate 2 may be either p-type or n-type. Regarding conductivity of the Si single crystal substrate 2, any appropriate substrate ranging from a highly insulative substrate having high specific resistance of 10,000 Ω·cm or higher to a substrate having low specific resistance of 0.001 Ω·cm or so can be used depending on applications. Examples of possible production method of the Si single crystal substrate 2 include the CZ method, the FZ method and other methods of various types. Si, SiC and the like may be epitaxially grown on a surface of the substrate. It is also possible to use a substrate having a thin oxide, nitride or carbide film formed on a surface thereof.

In particular, a substrate having specific resistance of 1000 Ω·cm or higher is preferably used when an epitaxial substrate for an electronic device having good high-frequency properties is to be produced. Such a substrate as described above is preferably produced by the FZ method in which highly purified Si crystals can be easily obtained.

A reaction between the Si single crystal substrate 2 and the initially grown layer 5 is suppressed and withstand voltage in the vertical direction is enhanced by forming the initially grown layer 5 by an AlN material. This aims at suppressing drop of withstand voltage in the vertical direction, which drop would be caused if the initially grown layer 5 were to be formed by a group III nitride material containing Ga and In because Ga and In are reacted with Si in the substrate, thereby generating defects and inducing through-defects in epitaxial layers. In the present embodiment, the AlN material may contain a very small amount of intended or unintended impurities by not more than 1%. For example, the AlN material may contain impurities such as Si, H, O, C, B, Mg, As, P, as well as aforementioned Ga and In.

In particular, when an epitaxial substrate for an electronic device having good high-frequency properties is to be produced, it is preferable that the Si single crystal substrate has specific resistance of 1000 Ω·cm or higher, total maximum concentrations of group III atoms in a portion of the Si single crystal substrate, from the interface between the substrate and the initially grown layer to 0.1 μm depth of the substrate, is $1 \times 10^{16}/cm^3$ or lower, and total concentrations of group III atoms of the Si single crystal substrate, at a position from the interface between the substrate and the initially grown layer to 0.3 μm depth of the substrate, is $1 \times 10^{15}/cm^3$ or lower. Loss due to capacitive or inductive coupling of charges existing in the substrate, with carriers generated at a surface of the substrate, when an electronic device is operated at a relatively high frequency can be suppressed by using a high-specific resistance substrate and effectively expanding a depletion layer. In this case, use of a Si single crystal substrate having specific resistance of 5000 Ω·cm or higher is particularly preferable because then loss during an operation at high frequency reaches a plateau. Further, by setting the total maximum concentrations of group III atoms functioning as p-type impurities in the Si single crystal substrate within the aforementioned ranges, it is possible to suppress loss caused by capacitive or inductive coupling of an electrode formed at a surface of the substrate with the p-type impurities when an electronic device is operated at high frequency. Concentration of impurities is measured by SIMS analysis. In the SIMS analysis, a distribution of impurity concentration in the depth direction is measured, while carrying out etching from the back side (i.e. the substrate side). The impurity concentration of Al is preferably lower than the impurity concentration of Ga in this regard because Al has lower activation energy and thus is more likely to generate p-type carriers than Ga does.

In order to prevent a Si single crystal substrate from being contaminated by impurities during an epitaxial growth process as described above to produce an epitaxial substrate for an electronic device having good high-frequency properties, it is important to:
1) lower the film-forming temperature; and
2) suppress island-like growth of the initially grown layer AlN and facilitate secondary growth thereof. It is preferable to suppress excessive nitridation of a surface of the Si single crystal substrate so as to make nitride film thickness thinner than 1 nm or avoid nitridation in order to realize 2) above. Excessive nitridation of a surface of the Si single crystal substrate results in a higher diffusion rate of a raw material at the outermost surface of the substrate and thus island-like growth of AlN, whereby the group III raw materials such as Al, Ga presumably diffuse from exposed portions of the substrate at an initial stage of growth.

Withstand voltage in the vertical direction can be enhanced by setting carbon concentration of the superlattice laminate 6 at $1 \times 10^{18}/cm^3$ or higher. Further, withstand voltage in a lateral direction can be enhanced and lateral leakage current can be suppressed by setting carbon concentration of the portion 4', on the buffer 3 side, of the main laminated body 4 at $1 \times 10^{18}/cm^3$ or higher. These carbon concentrations described above are preferably less than $1 \times 10^{20}/cm^3$ in terms of preventing pits from being generated due to too much increase in the impurity content. Contents of other impurities are not particularly specified. Although it is preferable to suppress contamination by donor impurities (Si, O, Ge) having relatively shallow impurity states, contamination by these impurities can be tolerated to some extent if the C content is high enough to compensate the states of the donors. Regarding impurity concentrations, a distribution of concentration of an impurity in the depth direction is measured, while carrying out etching from the front side by using SIMS analysis.

In the present embodiment, the definition that "a lateral direction of the epitaxial substrate is defined as an electric current conducting direction" means that electric current flows from the source electrode 24 to the drain electrode 25 mainly in the widthwise direction of the laminated body as shown in FIG. 1 and does not flow mainly in the vertical direction. i.e. the thickness direction of the laminated body, which would occur, for example, in a structure where a semiconductor is vertically sandwiched between a pair of electrodes.

Further, in the present embodiment, the definition that "the superlattice laminate is formed by alternate lamination of a first layer . . . and a second layer" means that the first layer 6a and the second layer 6b are laminated such that these layers periodically appear in the vertical direction in the superlattice laminate 6. The superlattice laminate 6 may include layers other than the first layer 6a and the second layer 6b (e.g. a composition transition layer) therebetween.

The carbon concentration of the portion 4' on the buffer 3 side of the main laminated body 4 is preferably higher than the carbon concentration of the superlattice laminate 6. In the portion 4', discrepancy in lattice constant between the buffer 3 and the main laminated body 4 causes a phenomenon that dislocations are bent in a lateral or diagonal direction, whereby a path through which leakage current easily flows is formed therein. Accordingly, leakage current is likely to flow in the portion 4' than in the buffer layer 3. The carbon concentration of the portion 4' is preferably set as described above in order to suppress this possible leakage current therethrough. Thickness of the portion 4' on the buffer 3 side of the main laminated body 4 is preferably set at not less than 0.1 μm because, in a case where the thickness is less than 0.1 μm, bending of dislocations may conspicuously occur even in a part where carbon concentration is relatively low, in the main laminated body 4. The upper limit of the thickness of the portion 4' is not particularly specified in terms of improvement of withstand voltage and decrease in leakage current but to be appropriately specified in terms of suppressing warp and/or cracks of the substrate. In a case where the composition of group III elements is changed only in the portion 4' or a case where the carbon concentration or the composition of group III elements is changed from the portion 4' to a portion of a channel layer 4a on the side opposite to the buffer layer, the composition and the concentration may change either rapidly or continuously.

It is preferable that the first layer 6a constituting the superlattice laminate 6 is made of an AlN material and the second layer 6b is made of an $Al_{b2}Ga_{c2}N$ ($a_2=0$, $0<b_2\leq0.5$, $0.5\leq c_2<1$, $d_2=0$) material. It is preferable to make difference in composition, i.e. difference in band gap, as large as possible because difference in band gap between the first layer 6a and the second layer 6b contributes to enhancement of withstand voltage in the vertical direction. In a case where mixed crystal is to be made of a group III nitride semiconductor material, the superlattice structure is preferably formed by an AlGaN material because AlN (6.2 eV) and GaN (3.5 eV) create the largest difference in band gap. Regarding the lower limit of difference in composition or difference in band gap between the first layer 6a and the second layer 6b, difference in composition is preferably 0.5 or larger because, when the difference in composition is smaller than 0.5, alleviation of stress effected by difference in lattice constant between Si single crystal and group III nitrides is insufficient and generation of cracks may be resulted. Regarding the upper limit of difference in composition, although the larger difference in composition is generally the better, it is preferable that the second layer having a relatively small band gap contains at least Al and the difference in composition between the first layer 6a and the second layer 6b is smaller than 1 in order to make the AlGaN layer itself sufficiently insulative and enhance withstand voltage. In a case where the second layer contains at least Al, carbon can be taken in more efficiently than otherwise. The number of pairs in superlattice is preferably 40 or more because then variation in withstand voltage can be reduced.

Regarding thickness of the respective layers, thickness of the first layer 6a having a relatively large band gap is preferably set within the range from a thickness which can basically suppress tunnel current to a film thickness which prevents cracks from being generated in terms of enhancing withstand voltage. For example, in a case where the first layer is made of AlN, thickness of the first layer is preferably set within the range of 2 to 10 nm. Thickness of the second layer 6b is to be appropriately set in view of controllably suppressing generation of cracks and warps. Specifically, thickness of the second layer 6b, i.e. the layer having a relatively small band gap, is preferably larger than the thickness of the layer having a relatively large band gap and less than 40 nm in order to effectively cause a strain-alleviating effect of the superlattice laminate structure and suppress generation of the cracks. The laminated layers of the superlattice laminate need not unanimously have the same layer thickness and composition.

The epitaxial substrate 1 for an electronic device is preferably used for a HEMT. The main laminated body 4 of the epitaxial substrate 1 shown in FIG. 2 may include the channel layer 4a made of a $B_{a3}Al_{b3}Ga_{c3}In_{d3}N$ ($0\leq a_3\leq1$, $0\leq b_3\leq1$, $0\leq c_3\leq1$, $0\leq d_3\leq1$, $a_3+b_3+c_3+d_3=1$) material and an electron supply layer 4b made of a $B_{a4}Al_{b4}Ga_{c4}In_{d4}N$ ($0\leq a_4\leq1$, $0\leq b_4\leq1$, $0\leq c_4\leq1$, $0\leq d_4\leq1$, $a_4+b_4+c_a+d_4=1$) material having a larger band gap than the channel layer 4a. Each of the channel layer 4a and the electron supply layer 4b may be constituted of either a single composition or plural compositions. At least a portion of the channel layer 4a, which portion is in contact with the electron supply layer 4b, is preferably made of a GaN material, in particular, in order to avoid alloy scattering and decrease specific resistance of current conducting portion.

A portion, on the side opposite to the buffer layer, of the channel layer 4a preferably has a relatively low carbon concentration, which is preferably not higher than $4\times10^{16}/cm^3$, because this portion of the channel layer 4a corresponds to a current conducting portion of the electronic device and thus should not include impurities which may inhibit conductivity and/or generate current collapse. However, the carbon concentration of the portion, on the side opposite to the buffer layer, of the channel layer 4a is preferably $1\times10^{15}/cm^3$ or higher in order to suppress current leakage by remaining carriers generated by n-type impurities.

Next, an embodiment of a method of producing an epitaxial substrate for an electronic device of the present invention will be described with reference to the drawings.

As shown in FIG. 2, the method of producing the epitaxial substrate 1 for an electronic device by sequentially forming on a Si single crystal substrate 2, a buffer 3 as an insulating layer, and a main laminated body 4 having a HEMT structure where plural group III nitride layers are epitaxially grown on the buffer 3, wherein a lateral direction of the epitaxial substrate is defined as an electric current conducting direction, includes the steps of forming the buffer 3 so as to include at least an initially grown layer 5 in contact with the Si single crystal substrate 2 and a superlattice laminate 6 constituted of a superlattice multilayer structure on the initially grown layer 5; forming the initially grown layer 5 by an AlN material; forming the superlattice laminate 6 by alternately laminating a first layer 6a made of a $B_{a1}Al_{b1}Ga_{c1}In_{d1}N$ ($0\leq a_1\leq1$, $0\leq b_1\leq1$, $0\leq c_1\leq1$, $0\leq d_1\leq1$, $a_1+b_1+c_1+d_1=1$) material and a second layer 6b made of a $B_{a2}Al_{b2}Ga_{c2}In_{d2}N$ ($0\leq a_2\leq1$, $0\leq b_2\leq1$, $0\leq c_2\leq1$, $0\leq d_2\leq1$, $a_2+b_2+c_2+d_2=1$) material having a band gap different from that of the first layer; and forming both of the superlattice laminate 6 and a portion 4', on the buffer 3 side, of the main laminated body 4 to have carbon concentration of $1 \times 10^{18}/cm^3$ or higher. It is possible to produce an epitaxial substrate for an electronic device, capable of making good properties of withstand voltage in the vertical direction and good properties of withstand voltage in a lateral direction compatible, as well as decreasing lateral leakage current, by the aforementioned method.

In a case where epitaxial growth is conducted by a CVD method, carbon can be added to the superlattice laminate 6 and the portion 4' on the buffer 3 side of the main laminated body 4 by some methods described below.

First method: A raw material gas containing carbon is separately added during growth of group III nitrides. Examples of the gas include methane, ethane, ethylene, acetylene, benzene, cyclopentane, and the like.

Second method: Methyl group, ethyl group or the like of organic metal is mixed into an epitaxially grown layer by controlling the group III nitride growth conditions. It is possible to adjust carbon concentration to be added to an epitaxial layer, by appropriately controlling temperature and pressure during epitaxial growth, epitaxial growth rate, flow rates of ammonium, hydrogen and nitrogen during epitaxial growth, and the like so as to suppress decomposition of organic metal.

In the present invention, carbon concentration of the superlattice laminate 6 represents a carbon concentration measured by SIMS at a site exposed by cutting the superlattice laminate 6 into half in the thickness direction thereof. Carbon concentration of the portion 4' on the buffer 3 side of the main laminated body 4 represents a carbon concentration measured by SIMS at a site exposed by cutting the portion 4' on the buffer 3 side of the main laminated body 4 into half in the thickness direction thereof.

FIG. 1 and FIG. 2 merely illustrate examples of typical embodiments and the present invention is not restricted to these embodiments. For example, it is acceptable to insert intermediate layers between the respective layers described above unless the insertion adversely affects the effect of the present invention, insert another superlattice layer, and apply gradient to the composition. Further, it is acceptable to form a nitride film, a carbide film, an Al film or the like on Si single crystal.

EXAMPLES

Example 1

An initially grown layer (AlN material with 100 nm thickness) and a superlattice laminate (totally 85 layers of AlN with 4 nm film thickness and $Al_{0.15}Ga_{0.85}N$ with 25 nm film thickness) were grown on each of (111) faces of 4 inch Si single crystal substrates having 600 μm thickness and specific resistance values of $1 \times 10^{-1}$ Ω·cm, $1 \times 10$ Ω·cm, $2 \times 10^3$ Ω·cm and $1 \times 10^4$ Ω·cm, respectively, to form buffer layers, followed by epitaxial growth of a channel layer (GaN material with 1.5 μm thickness) and an electron supply layer ($Al_{0.25}Ga_{0.75}N$ material with 20 nm thickness) on each of the buffer layers to form a main laminated body having a HEMT structure, whereby Samples 1 to 4 were obtained. Carbon concentrations of the superlattice laminates of these Samples were varied. Carbon concentration of a portion, on the buffer side, of each of the main laminated bodies of the Samples was within the range of 1.5 to $2.0 \times 10^{18}/cm^3$. Carbon concentration of a portion, on the electron supply layer side, of each of the channel layers of the main laminated bodies of the Samples was within the range of 0.8 to $3.5 \times 10^{16}/cm^3$. The temperatures and pressures during growths (which will be referred to as "growth temperature" and "growth pressure", respectively, hereinafter) of the respective layers are shown in Table 1. The carbon concentration of the superlattice laminate was adjusted by changing growth pressure $P_1$ shown in Table 1, for example, by decreasing film-forming pressure to increase carbon concentration therein. The MOCVD method was used as the growth method. TMA (trimethylaluminum) and TMG (trimethylgallium) were used as group III raw materials. Ammonium was used as a group V raw material. Hydrogen and nitrogen gases were used as carrier gases. In the present invention, "film-forming temperature" represents temperature of a substrate itself measured by using an infrared thermometer during growth of a film on the substrate. SIMS measurement of carbon concentration was carried out by conducting etching from the epitaxial layer side and using an analyzer manufactured by Cameca SAS, with $Cs^-$ as ion source at ion energy of 8 keV.

TABLE 1

| Layer | Growth pressure (kPa) | Growth temperature (C. °) |
|---|---|---|
| Initially grown layer | 10 | 1025 |
| Superlattice laminate | $P_1$ (1-120) | 1025 |
| Channel layer on buffer side | 10 | 1025 |
| Channel layer on electron supply layer side | 100 | 1075 |
| Electron supply layer | 10 | 1025 |

Example 2

Sample 5 was prepared by substantially the same method as Sample 2 of Example 1, except that the initially grown layer was formed by a GaN material (thickness: 20 nm) which grew at 700° C. and conditions of growth temperatures and growth pressures of the respective layers were set as shown in Table 2.

TABLE 2

| Layer | Growth pressure (kPa) | Growth temperature (C. °) |
|---|---|---|
| Initially grown layer | 10 | 700 |
| Superlattice laminate | $P_1$ (1-120) | 1025 |
| Channel layer on buffer side | 10 | 1025 |
| Channel layer on electron supply layer side | 100 | 1075 |
| Electron supply layer | 10 | 1025 |

Figure 3:
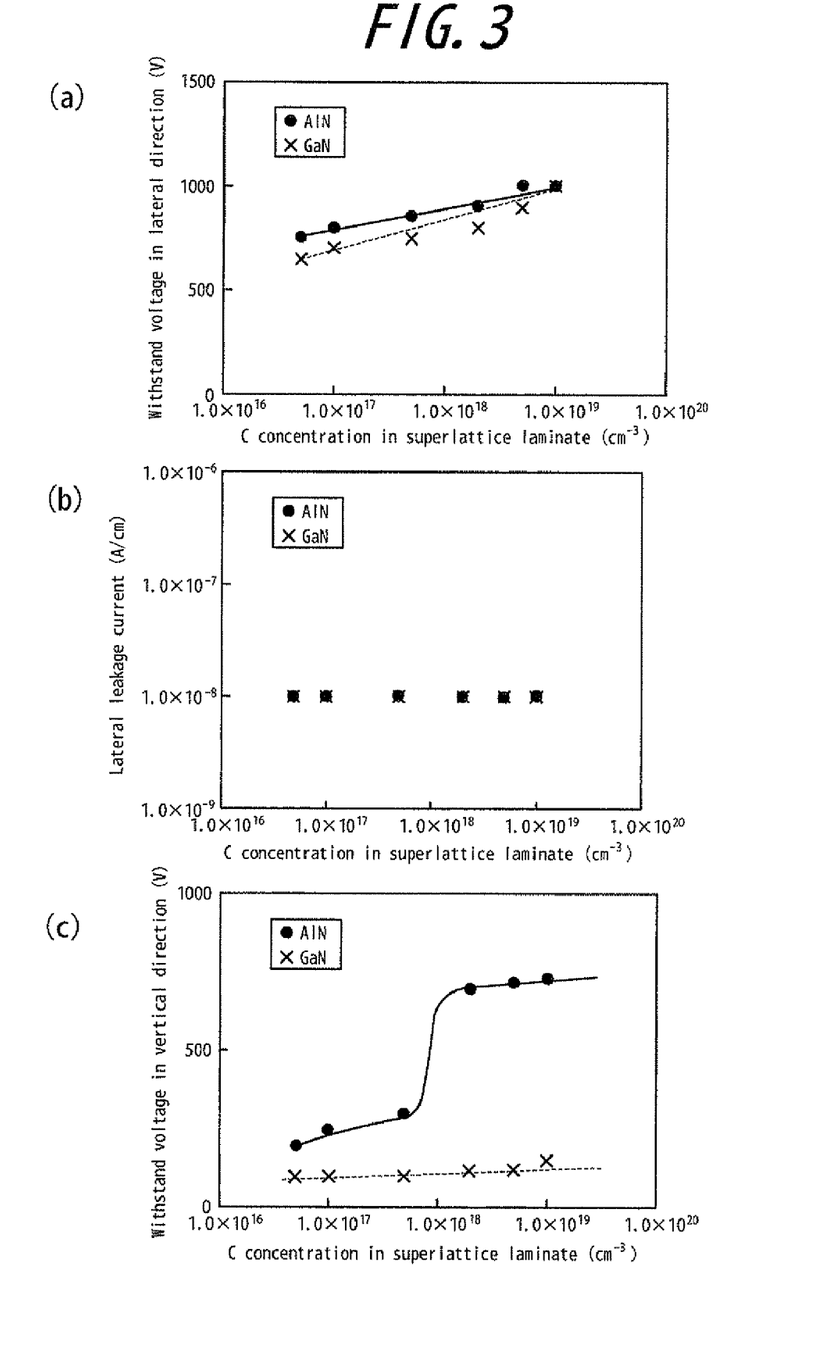
FIGS. 3(a), 3(b) and 3(c) are graphs showing measurement results of withstand voltage in a lateral direction, lateral leakage current, and withstand voltage in the vertical direction, respectively.

FIG. 3(*a*), FIG. 3(*b*) and FIG. 3(*c*) show measurement results of withstand voltage in lateral direction, lateral leakage current, and withstand voltage in vertical direction of Sample 2 and Sample 5, respectively. The measurement was carried out as follows.

Withstand voltage in vertical direction is measured by: forming on a surface of a substrate ohmic electrodes each having a Ti/Al laminate structure (80 μmφ); etching the outer side of each ohmic electrode by 50 nm thickness; grounding the back surface of the substrate on a metal plate; and measuring a value of electric current flowing between the electrodes with respect to a voltage.

Withstand voltage in lateral direction is measured by: forming ohmic electrodes each having a Ti/Al laminate structure (200 μm□ (square)) and disposing these electrodes on a substrate surface so as to be separated with 10 μm distance between facing sides of the electrodes; etching the periphery of each ohmic electrode by 150 nm thickness; and measuring a value of electric current flowing between the electrodes with respect to a voltage. During the measurement, the electrodes are insulated from each other with insulation oil in order to suppress discharge into the air. Further, an insulation plate is provided under the substrate to prevent leakage current from affecting the back surface of the substrate.

In Examples of the present invention, withstand voltage in the vertical direction is defined as a voltage value at which a converted current value in the vertical direction, per unit area of the electrode area, reaches $10^{-4}$ A/cm$^2$; withstand voltage in a lateral direction is defined as a voltage value at which a converted current value in the lateral direction, per one side length of the electrode, reaches $10^{-4}$ A/cm$^2$; and lateral leakage current is defined as a current value at 100 V in the lateral direction. Carbon concentration of the superlattice laminate 6 was obtained by measurement by SIMS at a site exposed by cutting the superlattice laminate 6 into half in the thickness direction thereof. Carbon concentration of the portion 4' on the buffer 3 side of the main laminated body 4 was obtained by measurement by SIMS at a site exposed by cutting the portion 4' on the buffer 3 side of the main laminated body 4 into half in the thickness direction thereof.

Changes in carbon concentration of the superlattice laminate hardly affects withstand voltage in a lateral direction and lateral leakage current. In contrast, it is understood that withstand voltage in the vertical direction of Sample 2 rapidly increases in a specific manner when the carbon concentration of the superlattice laminate exceeds $1\times10^{18}$/cm$^3$. It is also understood with reference to Sample 5 that this phenomenon specifically occurs in a case where the initially grown layer is made of AlN. Results similar to those of Sample 2 were obtained in Samples 1, 3 and 4, as well.

Example 3

Samples 6 to 9 were prepared by substantially the same method as Samples 1 to 4 of Example 1, except that growth pressure for the superlattice laminate was set 10 kPa, the carbon concentration of a portion on the buffer side of the main laminated body was varied, and conditions of growth temperatures and growth pressures of the respective layers were set as shown in Table 3. The carbon concentration of the superlattice laminate was adjusted by changing growth pressure $P_2$ shown in Table 3, for example, by decreasing film-forming pressure to increase carbon concentration therein. The carbon concentration of each of the superlattice bodies of Samples 6-9 was within the range of 1.5 to $2.5\times10^{18}$/cm$^3$.

TABLE 3

| Layer | Growth pressure (kPa) | Growth temperature (C. °) |
|---|---|---|
| Initially grown layer | 10 | 700 |
| Superlattice laminate | 10 | 1025 |
| Channel layer on buffer side | $P_2$ (1-120) | 1025 |
| Channel layer on electron supply layer side | 100 | 1075 |
| Electron supply layer | 10 | 1025 |

Figure 4:
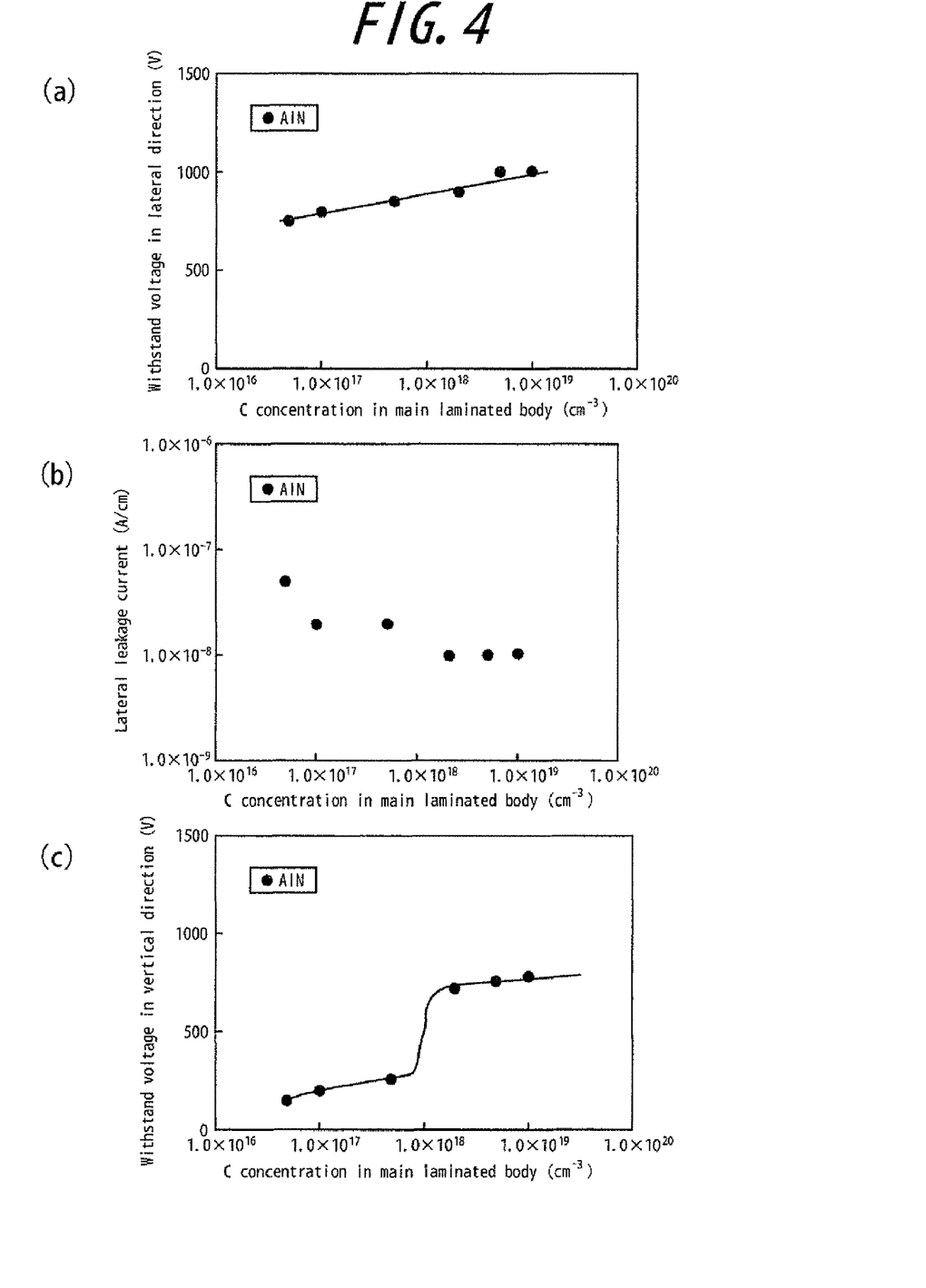
FIGS. 4(a), 4(b) and 4(c) are graphs showing measurement results of withstand voltage in a lateral direction, lateral leakage current, and withstand voltage in the vertical direction, respectively.

FIG. 4(a), FIG. 4(b) and FIG. 4(c) show measurement results of withstand voltage in lateral direction, lateral leak current and withstand voltage in vertical direction of Sample 6, respectively. It is confirmed from these measurement results that change in carbon concentration of the main laminated body does not cause substantial changes in withstand voltage in lateral direction and lateral leak current, while withstand voltage in vertical direction of Sample 6 rapidly increases in a specific manner when the carbon concentration in the portion on the buffer side of the main laminated body exceeds $1\times10^{18}$/cm$^3$. In this regard, the results of Samples 7 to 9, of which Si single crystal substrates in use each have specific resistance different from that of Sample 6, are not so different from the results of Sample 6 shown in FIG. 4(a), FIG. 4(b) and FIG. 4(c).

It is confirmed from Examples 1 to 3 that withstand voltage in vertical direction can be enhanced by setting the carbon concentrations in a portion on the buffer side of the superlattice laminate and a portion on the buffer side of the channel layer at a predetermined value or higher, respectively. On this basis, improvement of properties at a relatively high frequency is attempted in Example 4 in a state where carbon concentration of the buffer layer is set at the predetermined value or higher which has been confirmed to be preferable in Examples 1 to 3.

Example 4

An initially grown layer (AlN material with 100 nm thickness) and a superlattice laminate (totally 85 layers of AlN with 4 nm film thickness and $Al_{0.15}Ga_{0.85}N$ with 25 nm film thickness) were grown on (111) face of a 4 inch Si single crystal substrate having 600 μm thickness and specific resistance of $6\times10^3$ Ω·cm to form a buffer layer, with suppressing formation of an initial nitride layer, followed by epitaxial growth of a channel layer (GaN material with 1.5 μm thickness) and an electron supply layer ($Al_{0.25}Ga_{0.75}N$ material with 20 nm thickness) on the superlattice laminate under the conditions of growth pressure and growth temperature shown in Table 4 to form a main laminated body having a HEMT structure, whereby Sample 10 was obtained. Carbon concentration of the superlattice laminate of Sample 10 was varied. Carbon concentration of the superlattice laminate was $2.0\times10^{18}$/cm$^3$. Carbon concentration of a portion with 0.2 μm thickness, on the buffer side, of the main laminated body was $3.0\times10^{18}$/cm$^3$. Carbon concentration of a portion, on the electron supply layer side, of the channel layer was $1.0\times10^{16}$/cm$^3$.

TABLE 4

| Layer | Growth pressure (kPa) | Growth temperature (C. °) |
|---|---|---|
| Initially grown layer | 10 | 1005 |
| Superlattice laminate | 10 | 1005 |
| Channel layer on buffer side | 10 | 1015 |
| Channel layer on electron supply layer side | 100 | 1025 |
| Electron supply layer | 10 | 1025 |

When impurities in the Si single crystal substrate of Sample 10 was analyzed by SIMS, no group III element other than Al and Ga was observed; contents of Al, Ga were not higher than $1\times10^{16}$/cm$^3$, respectively; and Al and Ga respectively existed at a concentration of $1\times10^{15}$/cm$^3$ or higher in a region of the substrate within 0.2 μm (inclusive 0.2 μm) measured from the interface between the Si single crystal substrate and the initially grown layer, as shown in FIG. 5(a). Presence of a SiNx film with thickness of 1 nm or more was not confirmed by analysis of the interface between the Si single crystal substrate and the initially grown layer by TEM. It was confirmed that Al concentration is generally lower than Ga concentration in a region within 0.2 μm measured from the interface between the Si single crystal substrate and the initially grown layer, of the Si single crystal substrate. The SIMS measurement of Al, Ga was carried out by conducting etching from the Si single crystal side and using an analyzer manufactured by Cameca SAS, with $O_2^+$ as ion source at ion energy of 3 keV.

Further, CV measurement, carried out for the substrate of Sample 10 by using a mercury probe (manufactured by MSI electronics Inc.) and an impedance analyzer (HP4284A), revealed that a depletion layer had expanded to 8 μm or so in effective oxide thickness (ROT), as shown in FIG. 5(b). The frequency and amplitude of AC component in the CV measurement were 100 kHz and 10 mV, respectively. For convenience in measurement, it was assumed that the interface between the Si single crystal and the initially grown layer is located at a position shifted by 0.05 μm toward the substrate side from a position where Si concentration drops 1/5 in SIMS measurement. The aforementioned assumption makes it possible to prevent group III element concentrations from apparently increasing due to the Si single crystal and the epitaxial growth layer being exposed in a mixed manner, which exposure is caused by etching in the SIMS measurement.

Tests similar to those conducted for Sample 10 were conducted to Samples 11, 12, 13, as well, which Samples had been prepared in the substantially the same manner as Sample 10, except that 4 inch Si single crystal substrates in use of the former had specific resistance values of $2 \times 10^3$ Ω·cm, $8 \times 10^3$ Ω·cm and $12 \times 10^3$ Ω·cm, respectively. When impurities in the Si single crystal substrate of Samples 11 to 13 were analyzed by SIMS as in Sample 10, no group III element other than Al and Ga was observed; contents of Al, Ga were not higher than $1 \times 10^{16}/cm^3$, respectively; and Al and Ga respectively existed at a concentration of $1 \times 10^{15}/cm^3$ or higher in a region of the substrate within 0.2 μm (inclusive of 0.2 μm) measured from the interface between the Si single crystal substrate and the initially grown layer. Presence of a SiNx film with thickness of 1 nm or more was not confirmed by analysis of the interface between the Si single crystal substrate and the initially grown layer by TEM. It was confirmed that Al concentration is generally lower than Ga concentration in a region within 0.2 μm measured from the interface between the Si single crystal substrate and the initially grown layer, of the Si single crystal substrate. Further, it was confirmed that depletion layers of Samples 11 to 13 had expanded to 6 μm, 8 μm, and 8 μm or so in effective oxide thickness (EOT), respectively.

Example 5

Sample 14 was prepared in substantially the same manner as in Sample 2, except that, prior to the start of growing an initially grown layer, an initial nitride layer was intentionally formed on a 4 inch Si single crystal substrate having specific resistance of $5 \times 10^3$ Ω·cm with 600 μm thickness by only flowing ammonium gas (10% ammonium content with respect to hydrogen gas as carrier gas) for 5 minutes at 1050° C.

Figure 6:
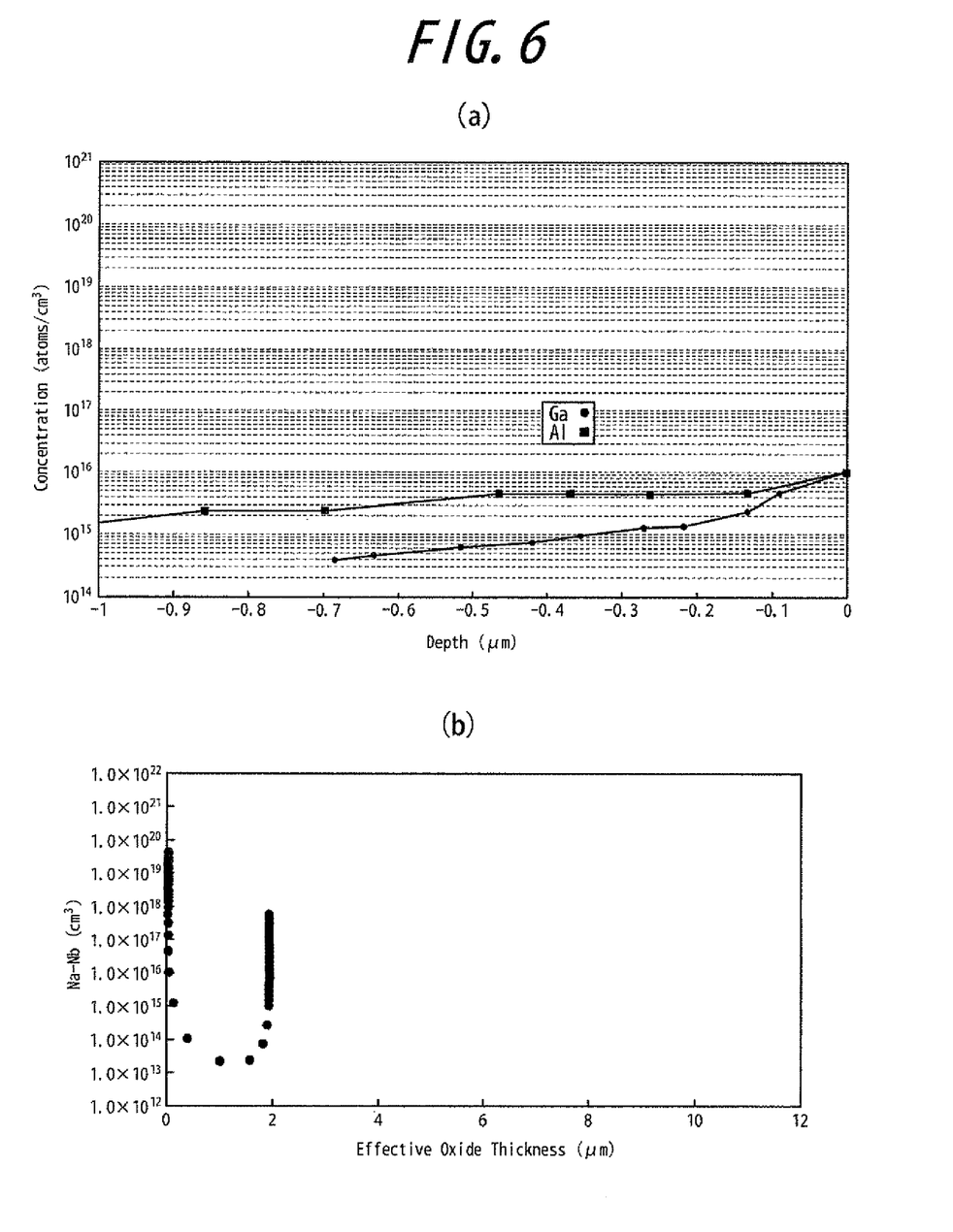
FIG. 6(a) is a graph showing results of SIMS and FIG. 6(b) is a graph showing results of CV.

When impurities in the Si single crystal substrate of Sample 14 was analyzed by SIMS, Al or Ga existed at a concentration of $1 \times 10^{15}/cm^3$ or higher in a region of 1 μm or more depth of the Si single crystal substrate measured from the interface between the Si single crystal substrate and the initially grown layer, although contents of Al and Ga each remain equal to or lower than $1 \times 10^{16}/cm^3$, as shown in FIG. 6(a). Presence of a SiNx film with thickness of 1.5 nm or so was confirmed by analysis of the interface between the Si single crystal substrate and the initially grown layer by TEM. It was also confirmed that Al concentration is generally higher than Ga concentration. Further, it was confirmed by CV measurement using a mercury probe that a depletion layer of Sample 14 had expanded only to approximately 2 μm in EOT in the substrate thereof, as shown in FIG. 6(b).

Example 6

Figure 5:
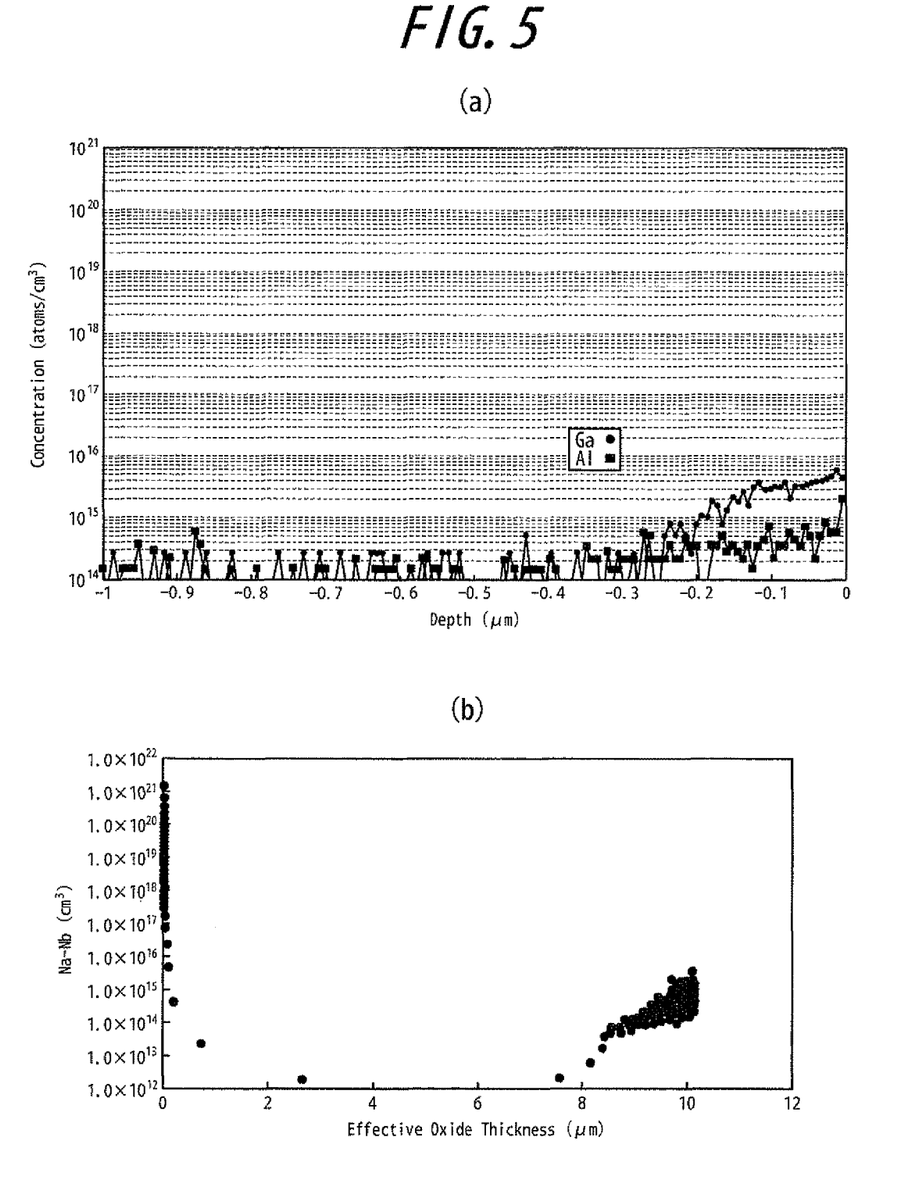
FIG. 5(a) is a graph showing results of SIMS and FIG. 5(b) is a graph showing results of CV.

Sample 15 was prepared in substantially the same manner as in Sample 10, except that growth temperature during a growth stage from the initially grown layer to the channel layer was raised under the conditions shown in FIG. 5.

TABLE 5

| Layer | Growth pressure (kPa) | Growth temperature (C. °) |
|---|---|---|
| Initially grown layer | 10 | 1025 |
| Superlattice laminate | 10 | 1025 |
| Channel layer on buffer side | 10 | 1025 |
| Channel layer on electron supply layer side | 100 | 1075 |
| Electron supply layer | 10 | 1025 |

Figure 7:
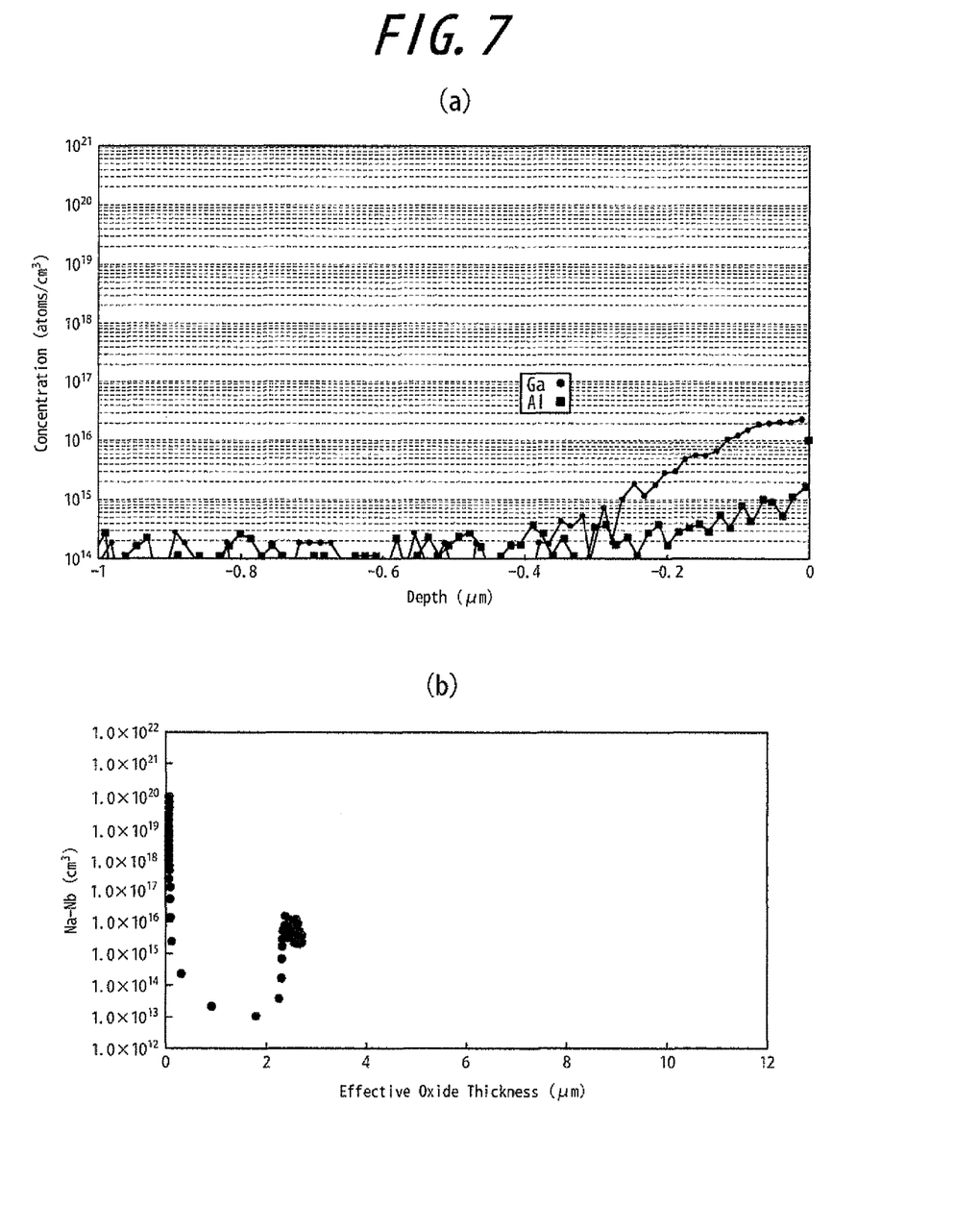
FIG. 7(a) is a graph showing results of SIMS and FIG. 7(b) is a graph showing results of CV.

When impurities in the Si single crystal substrate of Sample 15 was analyzed by SIMS, Ga existed at a concentration of $1 \times 10^{16}/cm^3$ or higher in a surface region, and Ga existed at a concentration of $1 \times 10^{15}/cm^3$ or higher only in a region of the substrate within 0.3 μm (inclusive of 0.3 μm), as shown in FIG. 7(a). Presence of a SiNx film with thickness of 1 nm or more was not confirmed by analysis of the interface between the Si single crystal substrate and the initially grown layer by TEM. It was confirmed that Al concentration is generally lower than Ga concentration in the Si single crystal substrate. Further, it was confirmed by CV measurement using a mercury probe that a depletion layer of Sample 14 had expanded only to approximately 2 μm in EOT in the substrate thereof, as shown in FIG. 7(b).

It is confirmed from comparison of Samples 1-13 with Samples 14, 15 that suppression of entry of Al and Ga into Si single crystal results in efficient expansion of a depletion layer. Efficient expansion of a depletion layer is synonymous with successful reduction of carriers within an epitaxial layer and a Si single crystal substrate, indicating that loss which occurs when an electronic device is operated at a relatively high frequency, due to capacitive or inductive coupling of an electrode formed at a surface of the substrate with the p-type impurities, can be suppressed.

The aforementioned superior effect is presumably caused by reducing thickness of a nitride layer (comparison of Sample 2 with Sample 14) and dropping film-forming temperature of an epitaxial layer (comparison of Sample 2 with Sample 15).

Electric properties of the channel layer portion were evaluated by a Hall effect measurement method for each of the epitaxial substrates produced by Examples described above. It has been confirmed from the evaluation that each of the epitaxial substrates exhibits good values of sheet resistance (not higher than 450Ω/□ (square)) and electron mobility (no lower than 1550 $cm^2$/Vs).

INDUSTRIAL APPLICABILITY

In the present invention, an epitaxial substrate for an electronic device has a buffer including an initially grown layer made of an AlN material and a predetermined superlattice laminate, a predetermined main laminated body on the buffer, and each of the superlattice laminate and a portion on the buffer side of the main laminated body has carbon concentration of $1 \times 10^{18}/cm^3$ or higher. Accordingly, it is possible not only to make decrease in lateral leakage current and achievement of good properties of withstand voltage in a lateral direction compatible but also enhance withstand voltage in the vertical direction. Further, the Si single crystal substrate of the present invention has specific resistance of 1000 Ω·cm or higher; total maximum concentrations of group III atoms in a portion, on the initially grown layer side, of the Si single crystal substrate is $1 \times 10^{16}/cm^3$ or lower; and total concentrations of group III atoms of the Si single crystal substrate, at a position from the interface between the substrate and the initially grown layer to 0.3 μm depth of the substrate, is $1 \times 10^{15}/cm^3$ or lower. Accordingly, in addition to the aforementioned advantages, it is possible to decrease loss occurring when high-frequency signals are applied.

Further, in the present invention, an epitaxial substrate for an electronic device is produced such that the epitaxial substrate has a buffer including an initially grown layer made of an AlN material and a predetermined superlattice laminate, a predetermined main laminated body on the buffer, and both of the superlattice laminate and a portion on the buffer side of the main laminated body has carbon concentration of $1 \times 10^{18}/cm^3$ or higher. Accordingly, it is possible not only to make decrease in lateral leakage current and achievement of good properties of withstand voltage in a lateral direction compatible but also enhance withstand voltage in the vertical direction. Moreover, in addition to the aforementioned advantages, it is possible to decrease loss occurring when high-frequency signals are applied.

| Explanation of Numeral References | |
|---|---|
| 1 | Epitaxial substrate for electronic device |
| 2 | Si single crystal substrate |
| 3 | buffer |
| 4 | Main laminated body |
| 4a | Channel layer |
| 4b | Electron supply layer |
| 5 | Initially grown layer |
| 6 | Superlattice laminate |
| 6a | First layer |
| 6b | Second layer |

The invention claimed is:

1. An epitaxial substrate for an electronic device comprising a Si single crystal substrate, a buffer as an insulating layer formed on the Si single crystal substrate, and a main laminated body formed by plural group III nitride layers epitaxially grown on the buffer, wherein a lateral direction of the epitaxial substrate is defined as an electric current conducting direction, wherein:
the buffer includes at least an initially grown layer in contact with the Si single crystal substrate and a superlattice laminate constituted of a superlattice multilayer structure on the initially grown layer;
the initially grown layer is made of an AlN material;
the superlattice laminate is formed by alternate lamination of a first layer made of a $B_{a1}Al_{b1}Ga_{c1}In_{d1}N$ ($0 \leq a_1 \leq 1$, $0 \leq b_1 \leq 1$, $0 \leq c_1 \leq 1$, $0 \leq d_1 \leq 1$, $a_1+b_1+c_1+d_1=1$) material and a second layer made of a $B_{a2}Al_{b2}Ga_{c2}In_{d2}N$ ($0 \leq a_2 \leq 1$, $0 \leq b_2 \leq 1$, $0 \leq c_2 \leq 1$, $0 \leq d_2 \leq 1$, $a_2+b_2+c_2+d_2=1$) material having a band gap different from that of the first layer; and
both of the superlattice laminate and a portion, on the buffer side, of the main laminated body has carbon concentration of $1 \times 10^{18}/cm^3$ or higher.

2. The epitaxial substrate for an electronic device of claim 1, wherein the first layer is made of an AlN material and the second layer is made of $Al_{b2}Ga_{c2}N$ ($a_2=0$, $0<b_2 \leq 0.5$, $0.5 \leq c_2 <1$, $d_2=0$).

3. The epitaxial substrate for an electronic device of claim 1, wherein:
the Si single crystal substrate has specific resistance of 1000 Ω·cm or higher and total maximum concentrations of group III atoms in a portion of the Si single crystal substrate, from the interface between the substrate and the initially grown layer to 0.1 μm depth of the substrate, is $1 \times 10^{16}/cm^3$ or lower; and
total concentrations of group III atoms of the Si single crystal substrate, at a position from the interface between the substrate and the initially grown layer to 0.3 μm depth of the substrate, is $1 \times 10^{15}/cm^3$ or lower.

4. A method of producing an epitaxial substrate for an electronic device by sequentially forming on a Si single crystal substrate a buffer as an insulating layer and a main laminated body as plural group III nitride layers epitaxially grown on the buffer, wherein a lateral direction of the epitaxial substrate is defined as an electric current conducting direction, comprising the steps of:
forming the buffer so as to include at least an initially grown layer in contact with the Si single crystal substrate and a superlattice laminate constituted of a superlattice multilayer structure on the initially grown layer;
forming the initially grown layer by an AlN material;
forming the superlattice laminate by alternately laminating a first layer made of a $B_{a1}Al_{b1}Ga_{c1}In_{d1}N$ ($0 \leq a_1 \leq 1$, $0 \leq b_1 \leq 1$, $0 \leq c_1 \leq 1$, $0 \leq d_1 \leq 1$, $a_1+b_1+c_1+d_1=1$) material and a second layer made of a $B_{a2}Al_{b2}Ga_{c2}In_{d2}N$ ($0 \leq a_2 \leq 1$, $0 \leq b_2 \leq 1$, $0c_2 \leq 1$, $0 \leq d_2 \leq 1$, $a_2+b_2+c_2+d_2=1$) material having a band gap different from that of the first layer; and
forming both of the superlattice laminate and a portion, on the buffer side, of the main laminated body to have carbon concentration of $1 \times 10^{18}/cm^3$ or higher.

5. The method of producing an epitaxial substrate for an electronic device of claim 4, further comprising forming the Si single crystal substrate to have: specific resistance of 1000 Ω·cm or higher; total maximum concentrations of group III atoms of $1 \times 10^{16}/cm^3$ or lower in a portion thereof from the interface between the substrate and the initially grown layer to 0.1 μm depth of the substrate; and total concentrations of group III atoms of $1 \times 10^{15}/cm^3$ or lower at a position thereof from the interface between the substrate and the initially grown layer to 0.3 μm depth of the substrate.

6. The epitaxial substrate for an electronic device of claim 2, wherein:
the Si single crystal substrate has specific resistance of 1000 Ω·cm or higher and total maximum concentrations of group III atoms in a portion of the Si single crystal substrate, from the interface between the substrate and the initially grown layer to 0.1 μm depth of the substrate, is $1 \times 10^{16}/cm^3$ or lower; and
total concentrations of group III atoms of the Si single crystal substrate, at a position from the interface between the substrate and the initially grown layer to 0.3 μm depth of the substrate, is $1 \times 10^{15}/cm^3$ or lower.

* * * * *